(12) United States Patent
Yang et al.

(10) Patent No.: US 11,088,032 B2
(45) Date of Patent: Aug. 10, 2021

(54) ELECTRONIC DEVICE BASED ON TWO-DIMENSIONAL SEMICONDUCTOR AND METHOD FOR MANUFACTURING ELECTRONIC DEVICE

(71) Applicant: Huawei Technologies Co., Ltd., Guangdong (CN)

(72) Inventors: Wen Yang, Shenzhen (CN); Riqing Zhang, Shanghai (CN); Yu Xia, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 36 days.

(21) Appl. No.: 16/239,401

(22) Filed: Jan. 3, 2019

(65) Prior Publication Data
US 2019/0139835 A1    May 9, 2019

Related U.S. Application Data

(63) Continuation of application No. PCT/CN2017/091509, filed on Jul. 3, 2017.

(30) Foreign Application Priority Data

Jul. 4, 2016    (CN) .......................... 201610520971.8

(51) Int. Cl.
*H01L 21/8238*    (2006.01)
*H01L 29/778*    (2006.01)
(Continued)

(52) U.S. Cl.
CPC ................ *H01L 21/823807* (2013.01); *H01L 21/02164* (2013.01); *H01L 21/02175* (2013.01);
(Continued)

(58) Field of Classification Search
None
See application file for complete search history.

(56) References Cited

U.S. PATENT DOCUMENTS

2002/0093017 A1    7/2002  Andry et al.
2012/0032149 A1*   2/2012  Chen .................. H01L 51/0048
                                                       257/24
(Continued)

FOREIGN PATENT DOCUMENTS

CN        1366351 A      8/2002
CN      102246312 A     11/2011
(Continued)

OTHER PUBLICATIONS

Rai et al., Interfacial-Oxygen-Vacancy Mediated Doping of MoS2 by High-K Dielectrics, IEEE, 2015 (Year: 2015).*
(Continued)

*Primary Examiner* — Xiaoming Liu
(74) *Attorney, Agent, or Firm* — Conley Rose, P.C.

(57) ABSTRACT

In embodiments of the present disclosure, an ambient medium of a two-dimensional semiconductor is doped or an ambient medium of a semiconductor is locally filled with a solid material, to form a filled region, and an electronic device based on the two-dimensional semiconductor is implemented by means of a doping effect of the doped region or the filled region on a characteristic of the two-dimensional semiconductor. In the embodiments of the present disclosure, doping the two-dimensional semiconductor is not directly processing the two-dimensional semiconductor. Therefore, damage caused to the two-dimensional semiconductor in a doping process and device performance deterioration caused accordingly can be effectively reduced, and stability of device performance after doping is improved.

20 Claims, 12 Drawing Sheets

(51) Int. Cl.
*H01L 21/265* (2006.01)
*H01L 29/739* (2006.01)
*H01L 29/786* (2006.01)
*H01L 29/66* (2006.01)
*H01L 21/02* (2006.01)
*H01L 27/092* (2006.01)
*H01L 29/24* (2006.01)

(52) U.S. Cl.
CPC .... *H01L 21/265* (2013.01); *H01L 21/823857* (2013.01); *H01L 27/092* (2013.01); *H01L 29/66969* (2013.01); *H01L 29/7391* (2013.01); *H01L 29/778* (2013.01); *H01L 29/78645* (2013.01); *H01L 29/78681* (2013.01); *H01L 29/24* (2013.01)

(56) References Cited

U.S. PATENT DOCUMENTS

| | | | |
|---|---|---|---|
| 2012/0326126 A1* | 12/2012 | Chen | H01L 51/0023 257/29 |
| 2013/0285124 A1 | 10/2013 | Mouli et al. | |
| 2014/0077160 A1 | 3/2014 | Dai et al. | |
| 2014/0131698 A1* | 5/2014 | Kim | H01L 29/24 257/42 |
| 2014/0158988 A1 | 6/2014 | Chen et al. | |
| 2014/0306184 A1 | 10/2014 | Ruhl et al. | |
| 2015/0214482 A1 | 7/2015 | Park et al. | |
| 2015/0364472 A1 | 12/2015 | Kim et al. | |
| 2016/0104790 A1 | 4/2016 | Oh | |
| 2017/0110564 A1* | 4/2017 | Kim | H01L 29/66037 |
| 2017/0110678 A1* | 4/2017 | Zang | G01N 27/4141 |
| 2017/0213854 A1* | 7/2017 | Wang | H01L 27/1225 |

FOREIGN PATENT DOCUMENTS

| | | |
|---|---|---|
| CN | 104078501 A | 10/2014 |
| CN | 104766888 A | 7/2015 |
| CN | 106129112 A | 11/2016 |

OTHER PUBLICATIONS

Goniszewski et al. Correlation of p-doping in CVD Graphene with Substrate Surface Charges, Nature, Mar. 9, 2016 (Year: 2016).*
Wenzhong Bao et al, "High Mobility Ambipolar MoS2 Field-Effect Transistors: Substrate and Dielectric Effects," Applied Physics Letters, Dec. 2012, 13 pages.
Yu, T., et al., "Local electrical stress-induced doping and formation of monolayer graphene P—N junction" XP012141078, Applied Physics Letters, AIP Publishing LLC, vol. 98, No. 24, Jun. 13, 2011, 4 pages.
Foreign Communication From a Counterpart Application, European Application No. 17823591.7, Extended European Search Report dated May 22, 2019, 10 pages.

* cited by examiner

ELECTRONIC DEVICE BASED ON TWO-DIMENSIONAL SEMICONDUCTOR AND METHOD FOR MANUFACTURING ELECTRONIC DEVICE

CROSS-REFERENCE TO RELATED APPLICATIONS

This application is a continuation of International Application No. PCT/CN2017/091509 filed on Jul. 3, 2017, which claims priority to Chinese Patent Application No. 201610520971.8 filed on Jul. 4, 2016. The disclosures of the aforementioned applications are hereby incorporated by reference in their entireties.

TECHNICAL FIELD

The present application relates to the field of electronic technologies, and in particular, to an electronic device based on a two-dimensional semiconductor and a method for manufacturing the electronic device.

BACKGROUND

Application of new materials, new structures, and new technologies, for example, application of stressed silicon, high-k gate media, metal gates, fin field effect transistors (FinFET), and ultra-thin body field effect transistors (UTB FET), is accompanied with not only a continuous decrease in a size of a transistor, but also continuous improvement of performance of the transistor. However, as the size of the transistor continues to decrease, especially, to a size smaller than 10 nm, probably, the prior art already cannot resolve a problem of device performance deterioration caused by a decrease in the device size. Emergence of a two-dimensional semiconductor material makes it possible to reduce the device size. A single layer or a small quantity of layers of two-dimensional semiconductor materials have an atom-level thickness, and can greatly enhance control force of a gate over a channel when the single layer or the small quantity of layers of two-dimensional semiconductor materials are used as the channel region materials. In addition, compared with a conventional semiconductor material, the two-dimensional semiconductor material can effectively avoid occurrence of a short channel effect in a small-size device. Diversity of two-dimensional semiconductor materials may also provide multiple choices for devices having different requirements. Therefore, the two-dimensional semiconductor material is considered as an important material, which is expected to prolong Moore's Law, in a future integrated circuit.

For a two-dimensional semiconductor material, such as transition metal dichalcogenides (TMDs), bismuth selenide ($Bi_2Se_3$), or black phosphorus, proper doping not only can adjust and control concentration and a type of carriers according to a requirement of a device, but also can effectively reduce contact resistance between the two-dimensional semiconductor material and metal. However, a thickness of a single layer or a small quantity of layers of two-dimensional semiconductors is very small (a thickness of a single layer of $MoS_2$ is 0.65 Å only), and a conventional semiconductor doping method, that is, ion injection, is no longer applicable to the two-dimensional semiconductor material.

A first doping method in the prior art is substitutional doping. A general way is to introduce an impurity in a two-dimensional semiconductor growth process, so that an impurity atom exists in a lattice of a two-dimensional semiconductor by replacing some atoms in the two-dimensional semiconductor. For example, some molybdenum atoms are replaced with niobium atoms, so that molybdenum disulfide is doped with the niobium atoms. The substitutional doping has a stable doping effect, but causes much damage to the lattice of the two-dimensional semiconductor. Consequently, an electrical property such as field-effect mobility of the two-dimensional semiconductor deteriorates.

A second doping method in the prior art is surface charge transfer. Some specific gases, liquid molecules, or solid thin films are attached to a surface of the two-dimensional semiconductor, and the two-dimensional semiconductor is doped by means of charge transfer between the attached molecules and the two-dimensional semiconductor. For example, p-type doping may be performed on $WSe_2$ by means of charge transfer between nitrogen dioxide ($NO_2$) and tungsten diselenide ($WSe_2$), and n-type doping may be performed on $MoS_2$ by means of charge transfer between cesium carbonate ($Cs_2CO_3$) and molybdenum disulfide ($MoS_2$). However, the doping method based on the surface charge transfer is easily affected by an ambient environment. Consequently, a doping effect is unstable. For example, after $WSe_2$ is doped with $NO_2$, $NO_2$ attached to a surface is difficult to keep stable in the air. Therefore, device performance after doping is unstable. While making a doping effect on a $MoS_2$ channel, a $Cs_2CO_3$ thin film covering a $MoS_2$ surface also provides a path for a leakage current between a source and a drain of a device, thereby increasing the leakage current of the device and reducing an on/off ratio.

A third doping method in the prior art is to process a two-dimensional semiconductor by using a plasma, to achieve an effect of doping the two-dimensional semiconductor. For example, $MoS_2$ is processed by using a sulfur hexafluoride ($SF_6$) plasma, thereby implementing p-type doping on $MoS_2$. However, a chemical bond on a surface of the two-dimensional semiconductor is damaged in a plasma doping process. Therefore, an electrical property of an electronic device is negatively affected.

Therefore, a new doping method needs to be further explored, so that while concentration and a type of carriers in a two-dimensional semiconductor are effectively adjusted and controlled, negative impact of doping on an electrical property of the two-dimensional semiconductor is reduced or eliminated.

SUMMARY

Embodiments of the present disclosure provide an electronic device based on a two-dimensional semiconductor and a method for manufacturing the electronic device.

According to a first aspect, an electronic device based on a two-dimensional semiconductor is provided. The electronic device includes:

an insulation medium layer, a channel region, a first electrode, and a second electrode, where a material of the insulation medium is $SiO_2$ or a high-k medium, and the channel region is a two-dimensional semiconductor layer; the insulation medium layer is provided with a doped region or a filled region, the doped region includes a dopant making a doping effect on the two-dimensional semiconductor layer, the filled region is filled with a solid material making a doping effect on the two-dimensional semiconductor layer, and the doping effect is n-type doping or p-type doping; and the two-dimensional semiconductor layer is located on the insulation medium layer, and at least a part of the two-dimensional semiconductor layer is located on the doped region or the filled region.

With reference to the first aspect, in a first possible implementation, the electronic device is a field effect transistor, the field effect transistor further includes a heavily doped silicon layer and a gate region, and the heavily doped silicon layer is located beneath the insulation medium layer; and the first electrode is a source, the second electrode is a drain, the gate region includes a gate medium and a gate electrode, the gate medium is located on the channel region, and the gate electrode is located on the gate medium. A gate region located on the channel region is usually also referred to as a top gate.

With reference to the first possible implementation of the first aspect, in a second possible implementation, the field effect transistor is a CMOS field effect transistor; the channel region includes a first channel region and a second channel region, the source includes a first source and a second source, the drain includes a first drain and a second drain, the gate region includes a first gate region and a second gate region, and the doped region includes a first doped region and a second doped region;

a doping type of the first doped region is n-type doping, the first channel region is located on the first doped region, the first source and the first drain are located on two sides of the first channel region, the first gate region includes a first gate medium and a first gate electrode, the first gate medium is located on the first channel region, and the first gate electrode is located on the first gate medium; and this part constitutes an nFET; and a doping type of the second doped region is p-type doping, the second channel region is located on the second doped region, the second source and the second drain are located on two sides of the second channel region, the second gate region includes a second gate medium and a second gate electrode, the second gate medium is located on the second channel region, and the second gate electrode is located on the second gate medium; and this part constitutes a pFET.

With reference to the first possible implementation of the first aspect, in a third possible implementation, the transistor is a gate-controlled P-N junction; the two-dimensional semiconductor exhibits an n-type conduction characteristic on the insulation medium layer, a doping type of the doped region is p-type doping, and an area of the doped region is smaller than an area of the channel region; or the two-dimensional semiconductor exhibits a p-type conduction characteristic on the insulation medium layer, a doping type of the doped region is n-type doping, and an area of the doped region is smaller than an area of the channel region.

With reference to the first aspect, in a fourth possible implementation, the electronic device is a thin film transistor, the first electrode is a source, the second electrode is a drain, the thin film transistor further includes a gate electrode and an insulation substrate, the gate electrode is located on the insulation substrate, and the insulation medium layer is located on the gate electrode.

According to a second aspect, a method for manufacturing an electronic device based on a two-dimensional semiconductor is provided, including:

forming a doped region or a filled region on an insulation medium layer, where a material of the insulation medium is $SiO_2$ or a high-k medium, the doped region includes a dopant making a doping effect on the two-dimensional semiconductor layer, and the filled region is filled with a solid material making a doping effect on the two-dimensional semiconductor layer; transferring the two-dimensional semiconductor layer onto the insulation medium layer; etching the two-dimensional semiconductor according to a size of the device and an area of the doped region, to form a channel region; and forming a first electrode and a second electrode on two sides of the etched two-dimensional semiconductor.

With reference to the second aspect, in a first possible implementation, the electronic device is a field effect transistor, and before the forming a doped region or a filled region on an insulation medium layer, the method further includes: forming the insulation medium layer on a heavily doped silicon layer; and after the forming a first electrode and a second electrode on two sides of the etched two-dimensional semiconductor, the method further includes: forming a gate medium on the channel region; and forming a gate electrode on the gate medium, where the first electrode is a source and the second electrode is a drain.

With reference to the first possible implementation of the second aspect, in a second possible implementation, the transistor is a gate-controlled P-N junction; the two-dimensional semiconductor exhibits an n-type conduction characteristic on the insulation medium layer, a doping type of the doped region is p-type doping, and the area of the doped region is smaller than an area of the channel region; or the two-dimensional semiconductor exhibits a p-type conduction characteristic on the insulation medium layer, a doping type of the doped region is n-type doping, and the area of the doped region is smaller than an area of the channel region.

With reference to the second aspect, in a third possible implementation, the electronic device is a thin film transistor, and before the forming a doped region or a filled region on an insulation medium layer, the method further includes:

forming a gate electrode on an insulation substrate; and forming the insulation medium layer on the gate electrode.

With reference to any one of the second aspect or the possible implementations of the second aspect, in a fourth possible implementation, the doping effect is n-type doping, and a doping source of the dopant includes at least one of the following: a plasma, a gas, and a chemical reagent that each contain amidogen, a gas and a solution (for example, a DCE solution) that each contain sodium ions, potassium ions, and chloridions, a PEI solution, a PTSA solution, a BV solution, an NADH solution, or a PVA solution.

With reference to any one of the second aspect or the possible implementations of the second aspect, in a fifth possible implementation, the doping effect is p-type doping, and a doping source of the dopant includes at least one of the following: a plasma or a gas containing O and F, a $Br_2$, $I_2$, or $AuCl_3$ solution, a solution containing Pt, Ag, Au, Pd, or Sc metal nano-particles, an $F_4TCNQ$ solution, or a TCNQ solution, where the plasma containing oxygen and fluorine includes: an $SF_6$ plasma, a $CHF_3$ plasma, a $CF_4$ plasma, and an $O_2$ plasma, and the gas containing oxygen and fluorine includes ozone and $NO_2$.

With reference to any one of the second aspect or the possible implementations of the second aspect, in a sixth possible implementation, the method for forming a filled region on an insulation medium layer includes:

etching the insulation medium layer, to obtain a trench; and filling the trench with the solid material making a doping effect on the two-dimensional semiconductor, to form the filled region.

With reference to the sixth possible implementation of the second aspect, in a seventh possible implementation, the doping effect is n-type doping and the solid material is $Cs_2CO_3$; or the doping effect is p doping and the solid material is $MoO_3$.

In either of the foregoing aspects or any one of the possible implementations, a material of the two-dimensional semiconductor is any of the following: $MoS_2$, $MoSe_2$, $MoTe_2$, $WS_2$, $WSe_2$, $WTe_2$, $GeS_2$, $GeSe_2$, $GeTe_2$, $SnS_2$, $SnSe_2$, $SnTe_2$, $SnO$, $PbS_2$, $PbSe_2$, $PbTe_2$, $GaS$, $GaSe$, $GaTe$, $InS$, $InSe$, $InTe$, $Bi_2Se_3$, graphene, black phosphorus, arsenene, antimonene, germanene, stanene, or silicene.

In either of the foregoing aspects or any one of the possible implementations, the high-k medium includes any one of the following: $Al_2O_3$, $WO_3$, $Ta_2O_5$, $HfO_2$, $ZnO_2$, $TiO_2$, $CaO$, $ZrO_2$, $La_2O_3$, $BaO$, $MgO$, $HfSiO_x$, $ZrSiO_x$, $HfLaO_x$, $HfZrO_x$, $HfAlO_x$, $LaAlO_x$, $Y_2O_3$, $SrO$, or $Si_3N_4$.

In either of the foregoing aspects or any one of the possible implementations, a quantity of layers of the two-dimensional semiconductor is 1 to 10.

In either of the foregoing aspects or any one of the possible implementations, the insulation medium layer is an even thin medium film. To manufacture an insulation medium layer, only a conventional method needs to be used in the present disclosure to form an even thin medium film, and the insulation medium layer does not need to have a special structure, a technique is simple, and manufacturing costs are low.

In the embodiments of the present disclosure, an ambient medium of the two-dimensional semiconductor is doped or an ambient medium of the semiconductor is locally filled with a solid material, to form the filled region, and the electronic device based on the two-dimensional semiconductor is implemented by means of a doping effect of the doped region or the filled region on a characteristic of the two-dimensional semiconductor. In the embodiments of the present disclosure, doping the two-dimensional semiconductor is not directly processing the two-dimensional semiconductor. Therefore, damage caused to the two-dimensional semiconductor in a doping process and device performance deterioration caused accordingly can be effectively reduced, and stability of device performance after doping is improved.

BRIEF DESCRIPTION OF THE DRAWINGS

To describe the technical solutions in the embodiments of the present disclosure more clearly, the following briefly describes the accompanying drawings required for describing the embodiments.

Figure 1:
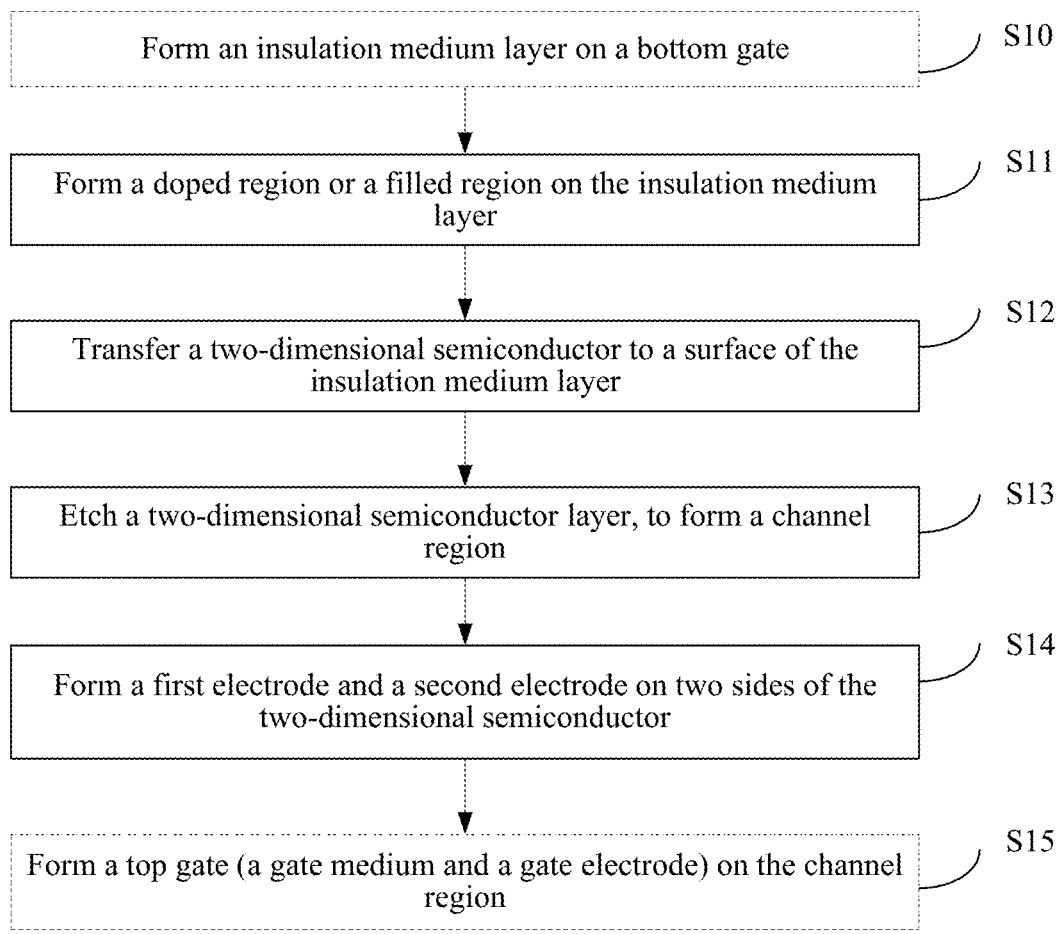
FIG. 1 is a flowchart of manufacturing an electronic device based on a two-dimensional semiconductor according to an embodiment of the present disclosure.

In the foregoing schematic structural diagrams, a scale of each part constituting a device in a figure does not represent an actual scale of the part.

DETAILED DESCRIPTION

To make the objectives, technical solutions, and advantages of the present disclosure clearer, the following further describes embodiments of the present disclosure in detail with reference to the accompanying drawings.

Abbreviations and chemical formulas that may be used in this application are first defined, as shown in Table 1.

TABLE 1

| Chinese and English description of abbreviation | | |
|---|---|---|
| Abbreviation/ Chemical formula | English definition | Chinese definition |
| CMOS | Complementary metal-oxide-semiconductor | 互补型金属-氧化物-半导体 |
| MOSFET | Metal-oxide-semiconductor field effect transistor | 金属-氧化物-半导体场效应晶体管 |
| FinFET | Fin field effect transistor | 鳍栅场效应晶体管 |
| UTB FET | Ultra-thin body field effect transistor | 超薄沟道场效应晶体管 |
| TMDs | Transition metal dichalcogenides | 过渡金属硫族化合物 |
| 2D nFET | Two dimensional semiconducfor based n type field effect transistor | 过渡金属硫族化合物 n 型场效应晶体管 |
| 2D pFET | Two dimensional semiconductor based p type field effect transistor | 基于二维半导体的 p 型场效应晶体管 |
| DCE | 1,2 dichloroethane | 二氯乙烷 |
| PEI | Polyethyleneimine | 聚乙烯亚胺 |

TABLE 1-continued

Chinese and English description of abbreviation

| Abbreviation/ Chemical formula | English definition | Chinese definition |
|---|---|---|
| PTSA | P-toluene sulfonic acid | 对甲苯磺酸 |
| BV | Benzyl viologen | 苄基紫精 |
| NADH | Nicotinamide adenine dinucleotide | 烟酰胺腺嘌呤二核苷酸 |
| PVA | Polyvinyl alcohol | 聚乙烯醇 |
| TCNQ | 7,7,8,8-tetracyano-quinodimethane | 7,7,8,8-四氰基对苯二醌二甲烷 |
| $F_4TCNQ$ | 2,3,5,6-tetrafluoro-7,7',8,8'-tetracyano-quinodimethane | 2,3,5,6,-四氟-7,7',8,8'-四氰二甲基对苯醌 |
| PI | Polyimide | 聚酰亚胺 |
| PET | Polyethylene terephthalate | 聚对苯二甲酸乙二酯 |
| ITO | Indium tin oxide | 氧化铟锡 |
| $SiO_2$ | Silicon dioxide | 二氧化硅 |
| $MoO_3$ | Molybdenum trioxide | 三氧化钼 |
| $Al_2O_3$ | Aluminum oxide | 氧化铝 |
| $WO_3$ | Tungsten trioxide | 三氧化钨 |
| $Ta_2O_5$ | Tantalum pentoxide | 五氧化二钽 |
| $HfO_2$ | Hafnium oxide | 二氧化铪 |
| $ZnO_2$ | Zinc peroxide | 过氧化锌 |
| $TiO_2$ | Titanium dioxide | 二氧化钛 |
| CaO | Calcium oxide | 氧化钙 |
| $ZrO_2$ | Zirconium dioxide | 二氧化锆 |
| $La_2O_3$ | Lanthanum oxide | 氧化镧 |
| BaO | Barium oxide | 氧化钡 |
| MgO | Magnesium oxide | 氧化镁 |
| $HfSiO_x$ | Hafnium silicon oxide | 氧化硅铪 |
| $ZrSiO_x$ | Zirconium silicon oxide | 氧化硅锆 |
| $HfLaO_x$ | Hafnium lanthanum oxide | 氧化镧铪 |
| $HfZrO_x$ | Hafnium zirconium oxide | 氧化锆铪 |
| $HfAlO_x$ | Hafnium aluminum oxide | 氧化铝铪 |
| $LaAlO_x$ | Lanthanum aluminum oxide | 氧化铝镧 |
| $Y_2O_3$ | Yttrium oxide | 氧化钇 |
| SrO | Strontium oxide | 氧化锶 |
| $Si_3N_4$ | Silicon nitride | 氮化硅 |
| $SF_6$ | Sulfur hexafluoride | 六氟化硫 |
| $CHF_3$ | Trifluoromethane | 三氟甲烷 |
| $CF_4$ | Carbon tetrafluoride | 四氟化碳 |
| $NO_2$ | Nitrogen dioxide | 二氧化氮 |
| $Br_2$ | Bromine | 溴 |
| $I_2$ | Iodine | 碘 |
| $AuCl_3$ | Gold trichloride | 三氯化金 |
| PMMA | Polymethyl methacrylate | 聚甲基丙烯酸甲酯 |
| $Cs_2CO_3$ | Cesium carbonate | 碳酸铯 |
| $MoS_2$ | Molybdenum disulfide | 二硫化钼 |
| $MoSe_2$ | Molybdenum diselenide | 二硒化钼 |
| $MoTe_2$ | Molybdenum ditelluride | 二碲化钼 |
| $WS_2$ | Tungsten disulfide | 二硫化钨 |
| $WSe_2$ | Tungsten diselenide | 二硒化钨 |
| $WTe_2$ | Tungsten ditelluride | 二碲化钨 |
| $GeS_2$ | Germanium disulfide | 二硫化锗 |
| $GeSe_2$ | Germanium diselenide | 二硒化锗 |
| $GeTe_2$ | Germanium ditelluride | 二碲化锗 |
| $SnS_2$ | Tin disulfide | 二硫化锡 |
| $SnSe_2$ | Tin diselenide | 二硒化锡 |
| $SnTe_2$ | Tin ditelluride | 二碲化锡 |
| SnO | Tin oxide | 一氧化锡 |
| $PbS_2$ | Lead disulfide | 二硫化铅 |
| $PbSe_2$ | Lead diselenide | 二硒化铅 |
| $PbTe_2$ | Lead ditelluride | 二碲化铅 |
| GaS | Gallium sulfide | 硫化镓 |
| GaSe | Gallium selenide | 硒化镓 |
| GaTe | Gallium telluride | 碲化镓 |
| InS | Indium sulphide | 硫化铟 |
| InSe | Indium selenide | 硒化铟 |
| InTe | Indium telluride | 碲化铟 |
| $Bi_2Se_3$ | Bismuth selenide | 硒化铋 |

Figure 2:
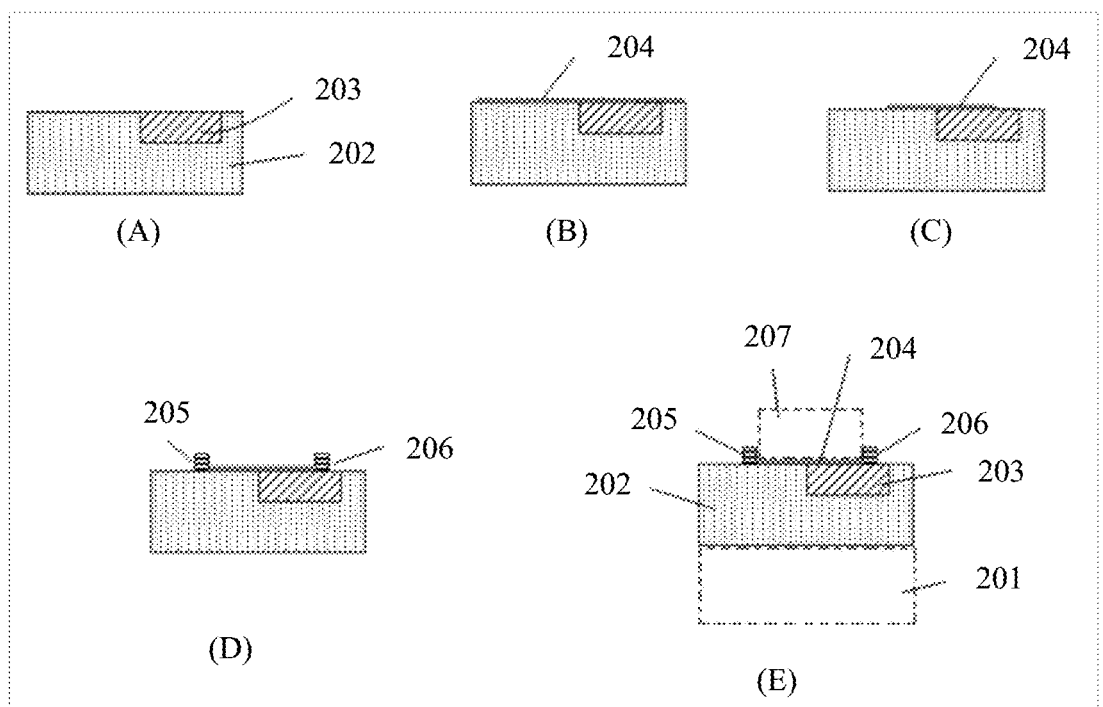
FIG. 2 is a structural side view illustrating manufacturing of an electronic device based on a two-dimensional semiconductor according to an embodiment of the present disclosure.

An embodiment of the present disclosure provides an electronic device based on a two-dimensional semiconductor, and the electronic device includes various types of transistors. FIG. 2(D) shows a basic structure of an electronic device related to a two-dimensional semiconductor. The basic structure includes: an insulation medium layer 202, a channel region 204, a first electrode 205, and a second electrode 206. The channel region 204 is located on the insulation medium layer 202. The first electrode 205 and the second electrode 206 are located on two sides of the channel region 204. If the electronic device is a field effect transistor, the first electrode 205 and the second electrode 206 are respectively used as a source and a drain of the device.

A material of the insulation medium layer is $SiO_2$ or a high-k medium. The channel region 204 is a two-dimensional semiconductor layer. The insulation medium layer is provided with a doped region 203, and the doped region 203 includes a dopant making a doping effect on a two-dimensional semiconductor layer. If a method for doping the insulation medium layer is not used, the insulation medium layer may alternatively be filled with a solid material making a doping effect on the two-dimensional semiconductor, to form a filled region 203.

The high-k medium may be any one of the following: $Al_2O_3$, $WO_3$, $Ta_2O_5$, $HfO_2$, $ZnO_2$, $TiO_2$, CaO, $ZrO_2$, $La_2O_3$, BaO, MgO, $HfSiO_x$, $ZrSiO_x$, $HfLaO_x$, $HfZrO_x$, $HfAlO_x$, $LaAlO_x$, $Y_2O_3$, SrO, or $Si_3N_4$. The dopant varies according to a device type and a performance requirement. For the insulation medium layer described herein, a conventional method may be used to form an even thin medium film, and a special structure is not needed.

At least a part of the two-dimensional semiconductor layer is located on the doped region (or the filled region) 203. According to different device types, a large area or a partial region of the insulation medium layer on which the channel region 204 (the two-dimensional semiconductor layer) is located may be doped or filled.

According to different device types, based on the foregoing basic structure, the device may further include a bottom gate 201 and/or a top gate 207 that are represented by dashed lines in FIG. 2(E). If there are multiple devices (for example, field effect transistors) on a same base, there are multiple doped regions (or filled regions), channel regions, first electrodes, and second electrodes accordingly. The doping effect described in this embodiment of the present disclosure may be n-type doping or p-type doping, and is specifically determined according to a device type and a performance requirement. The insulation medium layer on which the two-dimensional semiconductor is located is directly doped, so that the doped region may include dopants, and these dopants include a molecule, an ion, a functional group, or the like making a doping effect on the two-dimensional semiconductor.

Referring to FIG. 1, a method for manufacturing an electronic device shown in FIG. 2(D) includes the following steps:

S11. Form the doped region (or the filled region) 203 on the insulation medium layer 202, as shown in FIG. 2(A). If doping is performed, a conventional doping method may be used. If n-type doping is performed, a doping source includes, but is not limited to, at least one of the following: a sodium ion (Na), a potassium ion (K), a plasma, a gas, and a chemical reagent that each contain amidogen, a solution (for example, a DCE solution) containing chloridions (Cl), a PEI solution, a PTSA solution, a BV solution, an NADH solution, or a PVA solution. If p-type doping is performed, a doping source includes, but is not limited to, at least one of the following: a plasma or a gas such as an $SF_6$ plasma, a $CHF_3$ plasma, a $CF_4$ plasma, an $O_2$ plasma, ozone, or $NO_2$ containing oxygen (O) and fluorine (F), a $Br_2$, $I_2$, or $AuCl_3$ solution, a solution containing platinum (Pt), silver (Ag), gold (Au), palladium (Pd), or scandium (Sc) metal nanoparticles, an $F_4TCNQ$ solution, or a TCNQ solution.

S12. Transfer the two-dimensional semiconductor layer 204 onto the insulation medium layer including the doped region or the filled region, as shown in FIG. 2(B).

S13. Etching the two-dimensional semiconductor according to a size of the device and an area of the doped region, to form the channel region, as shown in FIG. 2(C).

S14. Form the first electrode 205 and the second electrode 206 on two sides of the etched two-dimensional semiconductor, as shown in FIG. 2(D).

If the electronic device has a bottom gate, before step S11, the method includes the following step:

S10. Form the insulation medium layer 202 on the bottom gate 201. As shown in FIG. 2(E), the bottom gate 201 is represented by a dashed box.

If the electronic device has a top gate, after step S14, the method further includes the following step:

S15. Form the top gate 207 on the channel region (the two-dimensional semiconductor layer) 204. As shown in FIG. 2(E), the top gate 207 is represented by a dashed box. The top gate generally includes a gate medium and a gate electrode. The gate medium (not shown in the figure) is usually formed on the channel region 204 first, and the gate electrode (not shown in the figure) is then formed on the gate medium.

A thickness of a single layer or a small quantity of layers (which are generally approximately two to ten layers) of the two-dimensional semiconductor materials is at an atom level only. Therefore, impact of an ambient medium environment and a manufacturing process on a characteristic of the two-dimensional semiconductor material is much stronger than impact on that of a conventional semiconductor. Using $MoS_2$ as an example, bulk $MoS_2$ generally exhibits an n-type semiconductor characteristic. However, as a thickness of $MoS_2$ is reduced (a quantity of layers is reduced), impact of the environment on the $MoS_2$ characteristic gradually becomes stronger. When the thickness of $MoS_2$ is reduced to a certain degree, a bipolar conduction characteristic may be exhibited due to specific environment (such as PMMA) induction. For another example, a small quantity of layers of black phosphorus exhibits a P-type (hole) dominant conduction characteristic on a $SiO_2$ substrate. However, after $Cs_2CO_3$ covers a surface of the black phosphorus, the small quantity of layers of black phosphorus gradually exhibits an N-type (electron) dominant conduction characteristic. For a feature that the two-dimensional semiconductor is sensitive to an ambient medium environment, in this embodiment of the present disclosure, by changing the ambient medium environment of the two-dimensional semiconductor (for example, a medium on which the two-dimensional semiconductor is located is doped or regionally filled), modulation of the medium and an interface of the two-dimensional semiconductor on the characteristic of the two-dimensional semiconductor is performed to implement a doping effect on the two-dimensional semiconductor. In this embodiment of the present disclosure, for the electronic device based on the two-dimensional semiconductor, doping processing is not directly performed on the two-dimensional semiconductor. Therefore, damage caused to the two-dimensional semiconductor in a doping process and device performance deterioration caused accordingly can be effectively reduced, and stability of device performance is improved.

Common two-dimensional semiconductor materials include: $MoS_2$, $MoSe_2$, $MoTe_2$, $W5_2$, $WSe_2$, $WTe_2$, $GeS_2$, $GeSe_2$, $GeTe_2$, $SnS_2$, $SnSe_2$, $SnTe_2$, SnO, $PbS_2$, $PbSe_2$, $PbTe_2$, GaS, GaSe, GaTe, InS, InSe, InTe, graphene, black phosphorus, arsenene, antimonene, germanene, stanene, silicene, and the like.

Specific embodiments in various application scenarios are described below.

Embodiment 1

A substrate medium (an insulation medium layer) on which a two-dimensional semiconductor is located is doped, to manufacture a CMOS device based on the two-dimensional semiconductor. Doping the substrate medium has two effects in this embodiment: 1. Concentration of carriers on a channel of the two-dimensional semiconductor is adjusted and controlled, to control different conduction types and device threshold voltages. 2. Concentration of carriers in a source, a drain, and extension regions thereof is controlled, to reduce contact resistance between the channel and a source electrode and between the channel and a drain electrode.

Figure 4:
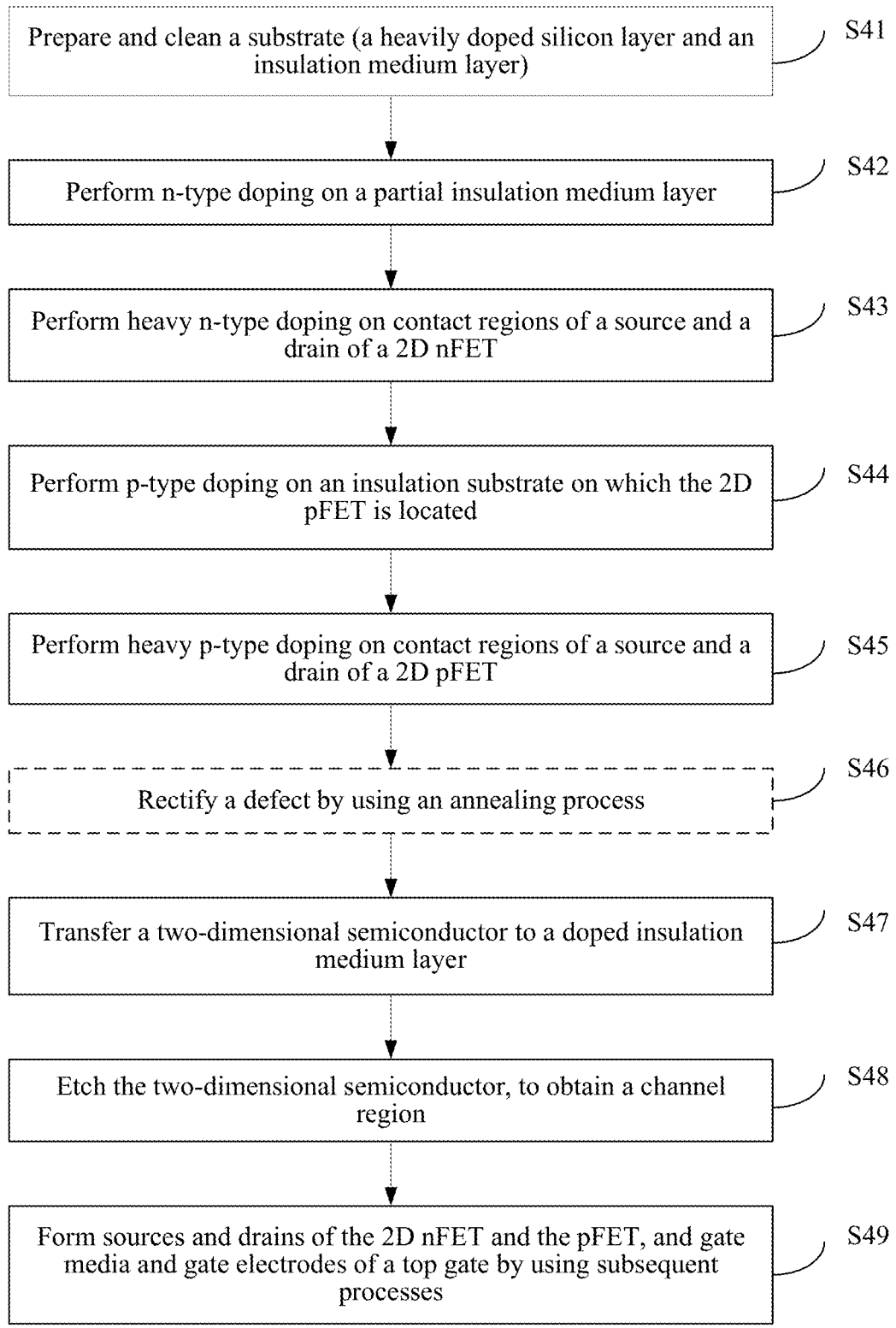
FIG. 4 is a flowchart of a method for manufacturing a CMOS field effect transistor according to an embodiment of the present disclosure.

Using manufacturing of a CMOS field effect transistor based on a two-dimensional semiconductor as an example, the CMOS field effect transistor includes an n-type field effect transistor (2D nFET) and a p-type field effect transistor (2D pFET) that are based on the two-dimensional semiconductor. As shown in FIG. 4, a process of manufacturing the CMOS field effect transistor includes the following steps.

Figure 3:
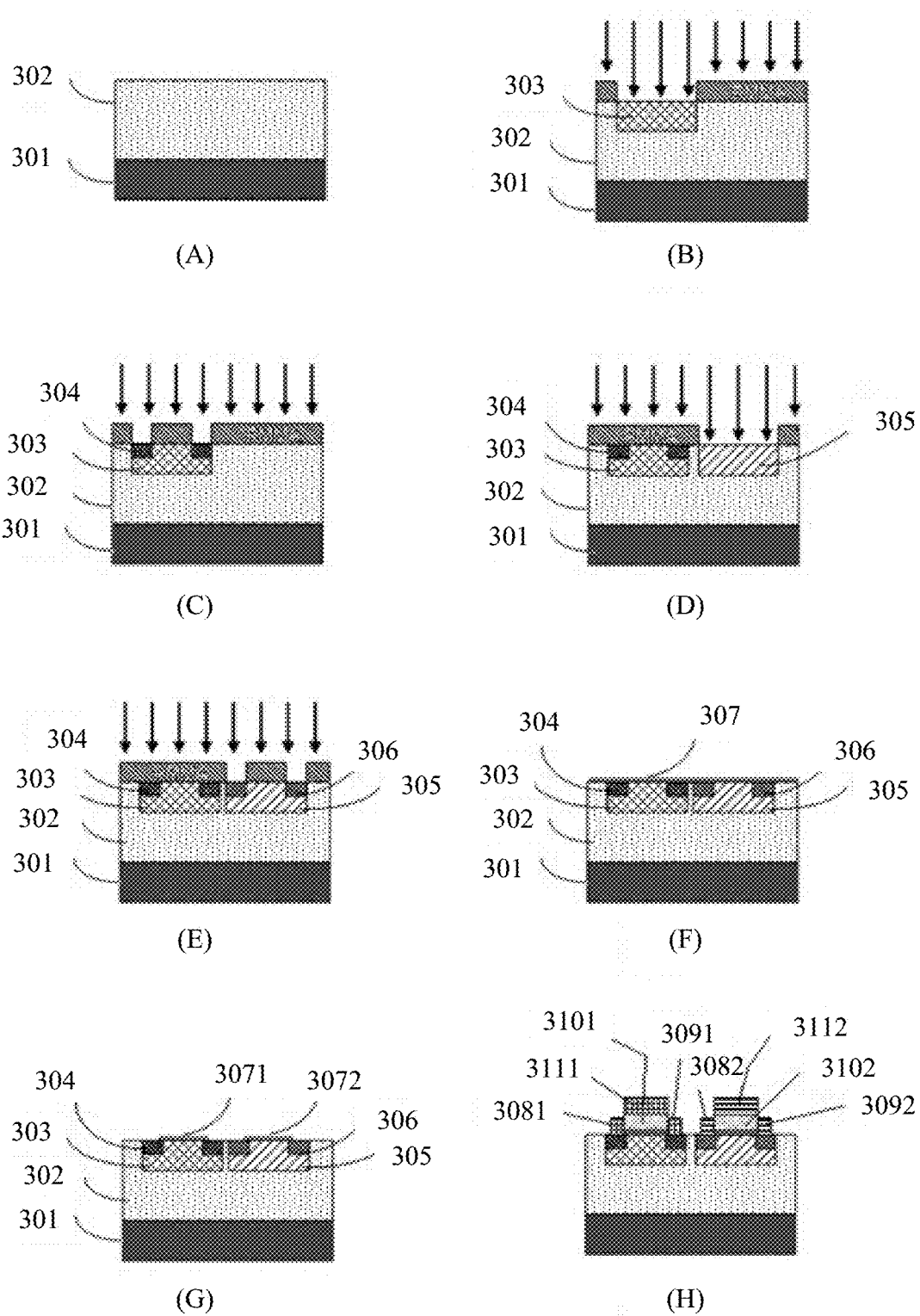
FIG. 3 is a structural side view corresponding to a process of manufacturing a CMOS field effect transistor according to an embodiment of the present disclosure.

S41. Prepare a substrate and clean the substrate. As shown in FIG. 3(A), the substrate may include a heavily doped silicon layer 301 and an insulation medium layer 302 located on the heavily doped silicon layer. The heavily doped silicon layer 301 is used as a back electrode, and may be grounded when the device works. Alternatively, a corresponding voltage may be applied as required. A material of the insulation medium layer 302 may be silicon dioxide ($SiO_2$) or a high-k medium.

S42. To manufacture the 2D nFET, first perform n-type doping on an insulation substrate (which is the insulation layer 302 in this embodiment) of a region in which the 2D nFET is located, to form an n-type doped region 303, as shown in FIG. 3(B). A doping source includes, but is not limited to, a sodium ion and a potassium ion, and a plasma, a gas, and a chemical reagent that each contain amidogen, a solution (for example, a DCE solution) containing chloridions, a PEI solution, a PTSA solution, a BV solution, an NADH solution, a PVA solution, and the like. Doping concentration is closely related to a category (original carrier concentration and an original carrier type) and a thickness (a quantity of layers) of the two-dimensional semiconductor, and a requirement on a threshold voltage of the 2D nFET. In this embodiment, tungsten diselenide ($WSe_2$) is used as an example of the two-dimensional semiconductor.

S43. Perform heavy n-type doping on a region in which a source and a drain of the 2D nFET are located, to form a heavily n-type doped region 304, so as to reduce contact resistance between the two-dimensional semiconductor and the source and between the two-dimensional semiconductor and the drain, as shown in FIG. 3(C). An area of the heavily n-type doped region 304 may be slightly larger than actual contact areas at the source and the drain.

S44. Perform p-type doping on the insulation substrate of the region in which the 2D pFET is located, to form a p-type doped region 305, as shown in FIG. 3(D). The doping source may be a plasma or a gas containing oxygen (O) or fluorine (F), such as an $SF_6$ plasma, a $CHF_3$ plasma, a $CF_4$ plasma, an $O_2$ plasma, ozone, or $NO_2$. The doping source may further include a $Br_2$, $I_2$, or $AuCl_3$ solution, a solution containing platinum (Pt), silver (Ag), gold (Au), palladium (Pd), or scandium (Sc) metal nano-particles, an $F_4TCNQ$ solution, and a TCNQ solution. Likewise, doping concentration is closely related to a category (original carrier concentration and an original carrier type) and a thickness (a quantity of layers) of the two-dimensional semiconductor, and a requirement on a threshold voltage of the 2D pFET. A spacing is required between the n-type doped region 303 and the p-type doped region 305, to achieve an objective of separation.

S45. Perform heavy p-type doping on a region in which a source electrode and a drain electrode of the 2D pFET are located, to reduce contact resistance between the two-dimensional semiconductor and a source and between the two-dimensional semiconductor and a drain, so as to form a heavily p-type doped region 306, as shown in FIG. 3(E). An area of the heavily p-type doped region 306 is slightly larger than actual contact areas at the source and the drain of the 2D pFET.

S46. Optionally, if a defect is introduced for the substrate in the doping process of steps S41 to S45, the defect can be rectified by using an annealing process.

S47. Transfer a two-dimensional semiconductor layer 307 onto a surface of the foregoing doped insulation medium layer, as shown in FIG. 3(F). The two-dimensional semiconductor may have a single layer or a small quantity of layers (1 to 10 layers).

S48. Etch the two-dimensional semiconductor according to a device size requirement and an area of a doped region by using a plasma etching process, to obtain channel regions 3071 and 3072, and isolate channels of different devices, as shown in FIG. 3(G). For transition metal dichalcogenides (TMDs) and graphene, etching may be performed by using an $O_2$ plasma. For another two-dimensional semiconductor, a plasma type used in an etching process may be selected according to an actual situation.

S49. Form sources (3081 and 3082) and drains (3091 and 3092) of the 2D nFET and the pFET, and gate media (3101 and 3102) and gate electrodes (3111 and 3112) of a top gate by using process steps, such as photoetching, metal deposition, and gate medium deposition. A finally formed device structure is shown in FIG. 3(H). The nFET is on the left, and the pFET is on the right. An example in which a same metal material is used for the gate electrodes, source electrodes, and drain electrodes of an nFET and a pFET is used in FIG. 3(H). In an actual situation, alternatively, different metal materials may be used.

As shown in FIG. 3(G) and FIG. 3(H), the CMOS field effect transistor provided in Embodiment 1 of the present disclosure includes:

the heavily doped silicon layer 301, the insulation medium layer 302, the first channel region 3071, the second channel region 3072, the first source 3081, the first drain 3091, the second source 3082, the second drain 3092, the first gate medium 3101, the second gate medium 3102, the first gate electrode 3111, and the second gate electrode 3112. The material of the insulation medium layer 302 is $SiO_2$ or the high-k medium. The insulation medium layer 302 is provided with the first doped region 303 and the second doped region 305. The first channel region 3071 and the second channel region 3072 are two-dimensional semiconductor layers. An area of the first doped region 303 is larger than that of the first channel region 3071. An area of the second doped region 305 is larger than that of the second channel region 3072. The first channel region 3071 and the second channel region 3072 are isolated from each other.

A doping type of the first doped region 303 is n-type doping, the first channel region 3071 is located on the first doped region 303, the first source 3081 and the first drain 3091 are located on two sides of the first channel region 3071, the first gate region includes the first gate medium 3101 and the first gate electrode 3111, the first gate medium 3101 is located on the first channel region 3071, and the first gate electrode 3111 is located on the first gate medium 3101. The first doped region 303, the first channel region 3071, the first source 3081, the first drain 3091, the first gate medium 3101, and the first gate electrode 3111 constitute the nFET.

A doping type of the second doped region 305 is p-type doping, the second channel region 3072 is located on the second doped region 305, the second source 3082 and the second drain 3092 are located on two sides of the second channel region 3072, a second gate region includes the second gate medium 3102 and the second gate electrode 3112, the second gate medium 3102 is located on the second channel region 3072, and the second gate electrode 3112 is located on the second gate medium 3102. The second doped region 305, the second channel region 3072, the second source 3082, the second drain 3092, the second gate medium 3102, and the second gate electrode 3112 constitute the pFET.

Different from the structure shown in FIG. 2(D), based on the structure shown in FIG. 2(D), heavily doped silicon is beneath the insulation medium layer, and is usually used as a back electrode (a back gate). In addition, one left transistor nFET and one right transistor pFET that are complementary are on the substrate, and each of the two complementary transistors has the channel region, the source, the drain, and the top gate (the gate medium and the gate electrode). There is a doped region beneath the entire channel region.

Embodiment 2

Figure 5:
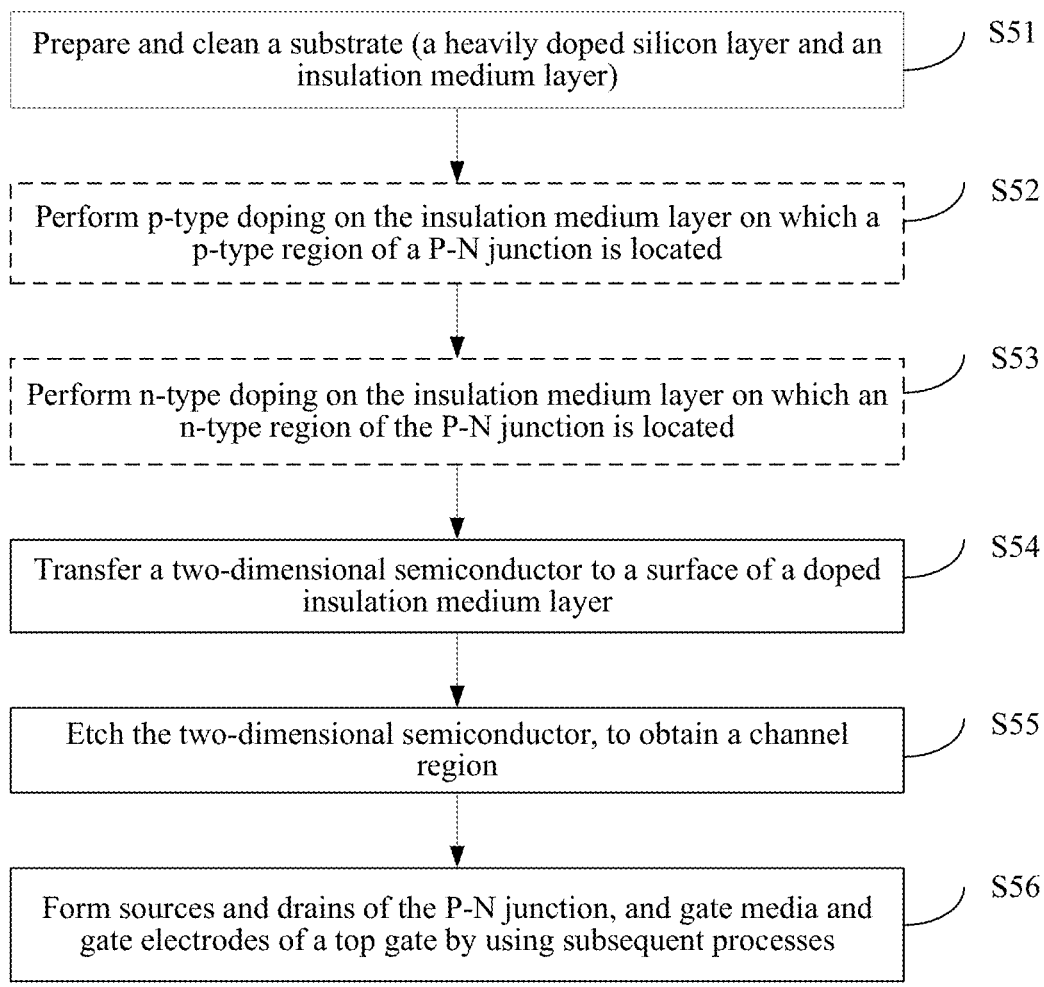
FIG. 5 is a flowchart of a method for manufacturing a gate-controlled P-N junction according to an embodiment of the present disclosure.
Figure 6:
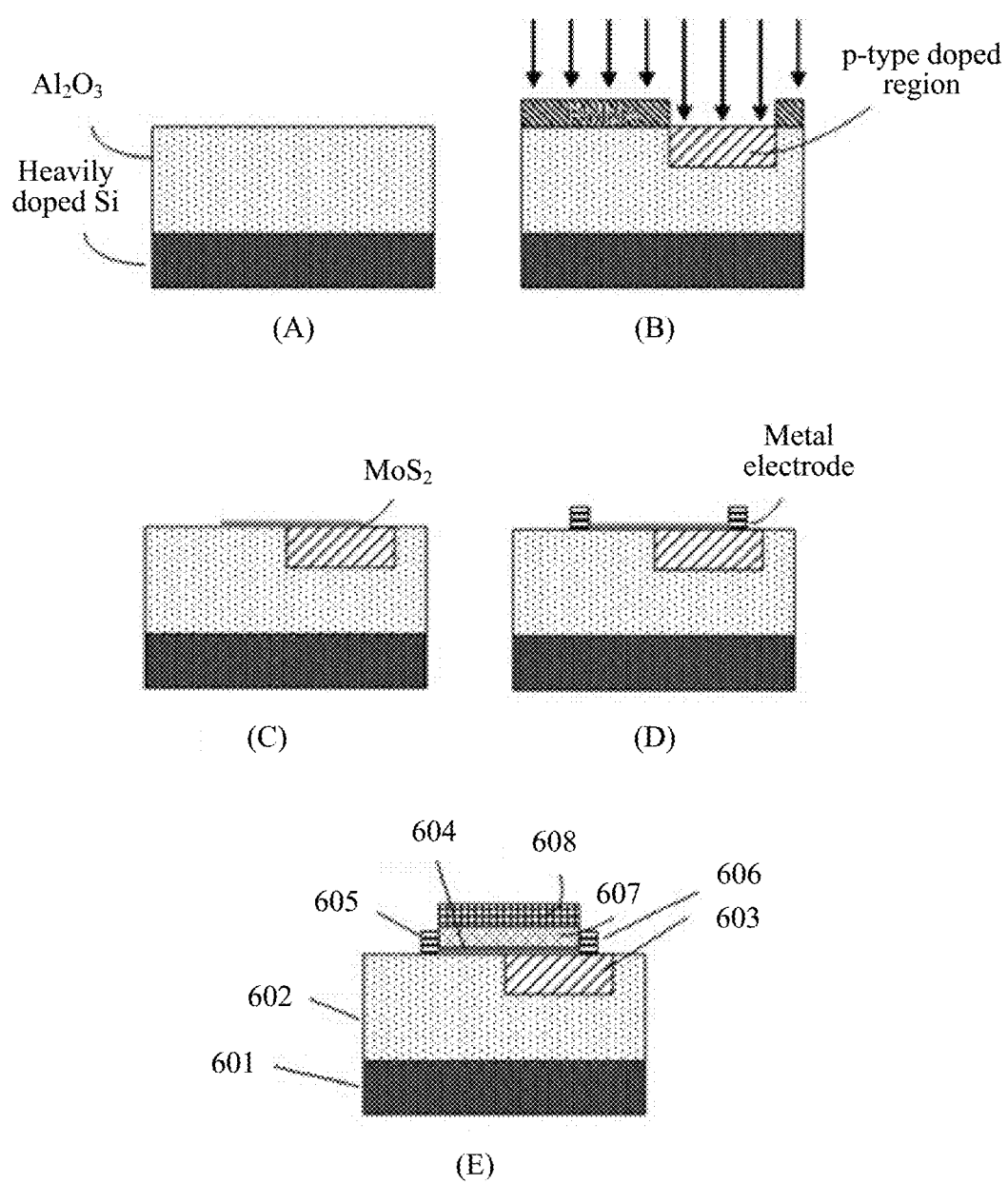
FIG. 6 is a structural side view of a method for manufacturing a gate-controlled P-N junction according to an embodiment of the present disclosure.

An insulation medium of a substrate is doped, to manufacture a gate-controlled P-N junction based on a two-dimensional semiconductor. In this embodiment, $MoS_2$ is used as an example of the two-dimensional semiconductor for description. However, a method and an application scenario that are used are also applicable to another two-dimensional semiconductor material. A process of manufacturing the gate-controlled P-N junction is shown in FIG. 5, and includes the following steps:

S51. Prepare and clean a substrate. As shown in FIG. 6(A), step S51 is the same as step S41 in Embodiment 1. In this embodiment, $Al_2O_3$ is used as an example of an insulation medium layer.

S52. Perform p-type doping on the insulation medium layer on which a p-type region of a P-N junction is located, as shown in FIG. 6(B). Use of a p-type doping source is the same as that in step S44 and step S45 in Embodiment 1.

S53. Because $MoS_2$ exhibits an n-type semiconductor conduction characteristic on an $Al_2O_3$ substrate, a process of performing n-type doping on the insulation medium substrate on which an n-type region of the P-N junction is located is omitted herein. However, when another two-dimensional semiconductor (such as $WSe_2$ or black phosphorus) exhibits a bipolar conduction characteristic on an $Al_2O_3$ substrate, or concentration of carriers in the two-dimensional semiconductor needs to be adjusted by means of n-type doping, n-type doping needs to be additionally performed herein on the insulation medium layer on which the n-type region of the P-N junction is located. Use of the doping source is the same as that in step S42 and step S43 in Embodiment 1. Different from Embodiment 1, there is no spacing between an n-type doped region and a p-type doped region. The two regions need to be closely related and an interface needs to be clear, so as to ensure a desirable electrical property of the P-N junction.

Similarly, for a two-dimensional material (for example, SnO) that originally exhibits a p-type semiconductor characteristic on a surface of the insulation substrate, regional p-type doping in step S52 in this embodiment needs to be changed to regional n-type doping, to form a homogeneous P-N junction. Use of an n-type doping source is the same as that in step S42 and step S43 in Embodiment 1.

S54. Transfer a single layer or a small quantity of layers of $MoS_2$ to a surface of an $Al_2O_3$ medium layer.

S55. Etch $MoS_2$ according to an area of the doped region and a device size requirement by using an etching process, to obtain a channel region, as shown in FIG. 6(C).

S56. Form a source and a drain of the gate-controlled P-N junction, and a gate medium and a gate electrode of a top gate by using photoetching, metal deposition, a lift-off (lift-off) process, a medium growth process, and the like, as shown in FIG. 6(D) and FIG. 6(E).

As shown in FIG. 6(E), the gate-controlled P-N junction manufactured according to this embodiment includes:

a heavily doped silicon layer 601, an insulation medium layer 602, a channel region 604, a first electrode 605, a second electrode 606, a gate medium 607, and a gate electrode 608. A material of the insulation medium layer 602 is $SiO_2$ or a high-k medium. The channel region 604 is a two-dimensional semiconductor layer.

The insulation medium layer 602 is provided with a doped region 603, and the doped region 603 includes a dopant making a doping effect on the two-dimensional semiconductor layer 604. If the two-dimensional semiconductor material exhibits an n-type conduction characteristic on the insulation medium layer 602, a doping type of the doped region 603 is p-type doping; or if the two-dimensional semiconductor material exhibits a p-type conduction characteristic on the insulation medium layer 602, a doping type of the doped region 603 is n-type doping.

The two-dimensional semiconductor layer (the channel region) 604 is located on the insulation medium layer 602. A part of the two-dimensional semiconductor layer is located on the doped region 603. An area of the doped region 603 is smaller than an area of the channel region 604.

The first electrode 605 and the second electrode 606 are located on two sides of the channel region 604, and are used as a source and a drain of the gate-controlled P-N junction. The gate medium 607 is located on the channel region 604. The gate electrode 608 is located on the gate medium 607.

Embodiment 3

Figure 7:
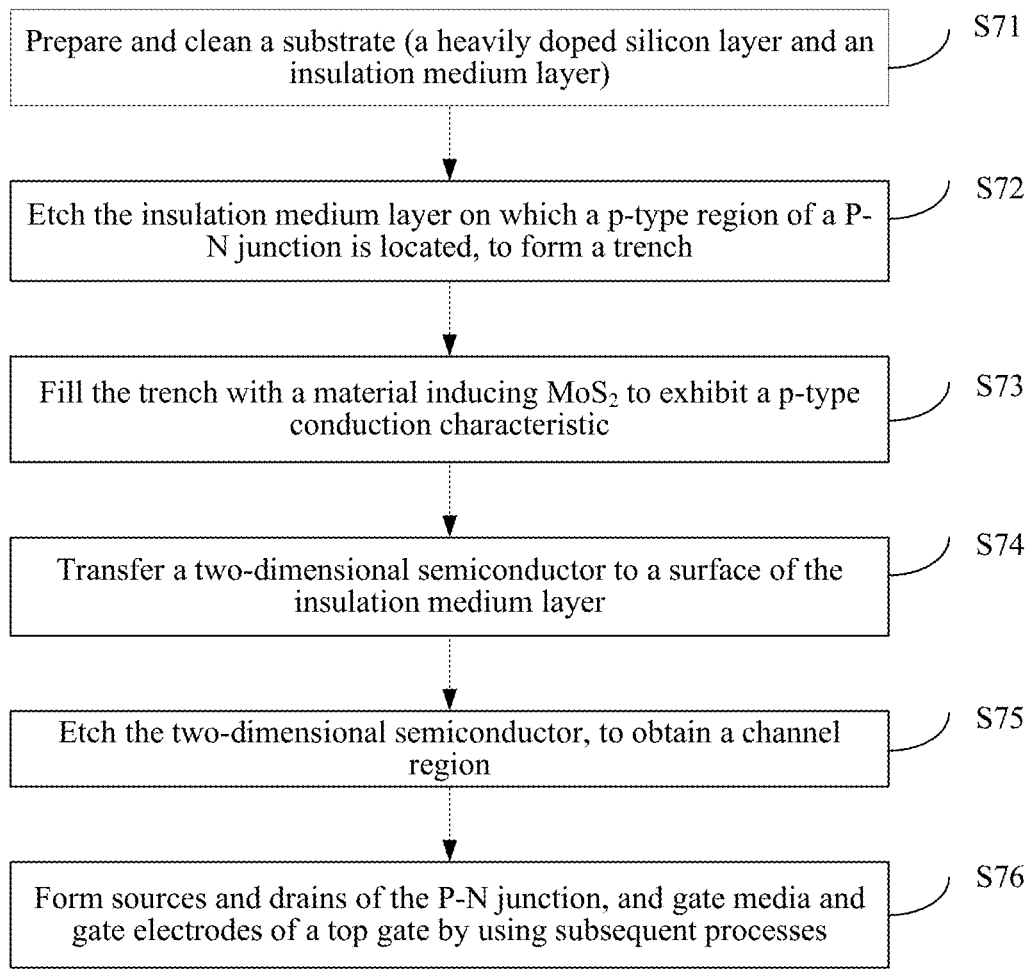
FIG. 7 is a flowchart of another method for manufacturing a gate-controlled P-N junction according to an embodiment of the present disclosure.

In this embodiment, a local substrate medium is replaced, to manufacture a gate-controlled P-N junction based on a two-dimensional semiconductor ($MoS_2$ is used as an example). The replacing the local substrate medium herein is filling a local region of an insulation medium layer with another solid material making a doping effect on the two-dimensional semiconductor. As shown in FIG. 7, a process of manufacturing the gate-controlled P-N junction includes the following steps.

Figure 8:
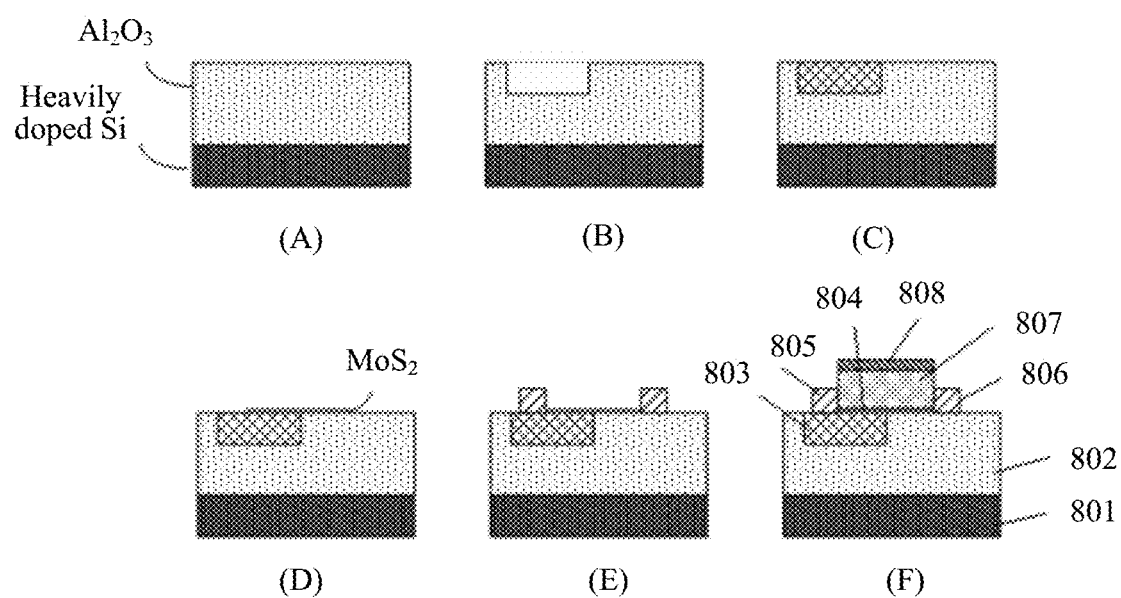
FIG. 8 is a structural side view of another method for manufacturing a gate-controlled P-N junction according to an embodiment of the present disclosure.

S71. Prepare and clean a substrate, as shown in FIG. 8(A). In this embodiment, $Al_2O_3$ is used as an example of the insulation medium layer.

S72. Define a p-type region of the P-N junction by using a photoetching process and etch away the insulation medium layer ($Al_2O_3$) at a corresponding location, to form a trench, as shown in FIG. 8(B).

S73. Fill the trench with a material inducing $MoS_2$ to exhibit a p-type conduction characteristic, to form a filled region, as shown in FIG. 8(C). The material is $MoO_3$ in this embodiment. In actual application, alternatively, a high-k medium and the like with relatively high content of PMMA and O may be used. For another two-dimensional semiconductor, a material that needs to be filled in a trench may be different, and needs to be selected according to an actual situation.

For a two-dimensional semiconductor material (for example, black phosphorus) exhibiting a p-type conduction characteristic on a surface of $Al_2O_3$, $SiO_2$, or another high-k medium, a material inducing the two-dimensional semiconductor to exhibit an n-type conduction characteristic needs to be filled in the trench obtained by means of etching. In this embodiment, $Cs_2CO_3$ is used for filling. For another two-dimensional semiconductor material, a material filled in a trench may be different, and needs to be selected according to an actual situation.

S74. Transfer a single layer or a small quantity of layers of $MoS_2$ to a surface of the substrate.

S75. Etch $MoS_2$ according to an area of the filled region and a device size requirement by using an etching process, to obtain a channel region of the device, as shown in FIG. 8(D).

S76. Form a source and a drain of the gate-controlled P-N junction, and a gate medium and a gate electrode of a top gate by using photoetching, metal deposition, a lift-off (lift-off) process, a medium growth process, and the like, as shown in FIG. 8(E) and FIG. 8(F).

As shown in FIG. 8(F), the gate-controlled P-N junction manufactured by means of this embodiment includes:

a heavily doped silicon layer 801, an insulation medium layer 802, a channel region 804, a first electrode 805, a second electrode 806, a gate medium 807, and a gate electrode 808. A material of the insulation medium layer 802 is $SiO_2$ or a high-k medium. The channel region 804 is a two-dimensional semiconductor layer.

The insulation medium layer 802 is provided with a filled region 803, and the filled region 803 is filled with a solid material making a doping effect on the two-dimensional semiconductor layer 804. If the used two-dimensional semiconductor material exhibits an n-type conduction characteristic on the insulation medium layer 802, a doping effect of the filled region 803 on the two-dimensional semiconductor is p-type doping; or if the used two-dimensional semiconductor material exhibits a p-type conduction characteristic on the insulation medium layer 802, a doping effect of the filled region 803 on the two-dimensional semiconductor is n-type doping.

The two-dimensional semiconductor layer 804 is located on the insulation medium layer 802. A part of the two-dimensional semiconductor layer is located on a doped region 803. An area of the doped region 803 is smaller than an area of the channel region 804.

The first electrode 805 and the second electrode 806 are located on two sides of the channel region 804, and are used as a source and a drain of the gate-controlled P-N junction. The gate medium 807 is located on the channel region 804. The gate electrode 808 is located on the gate medium 807.

Embodiment 4

Figure 9:
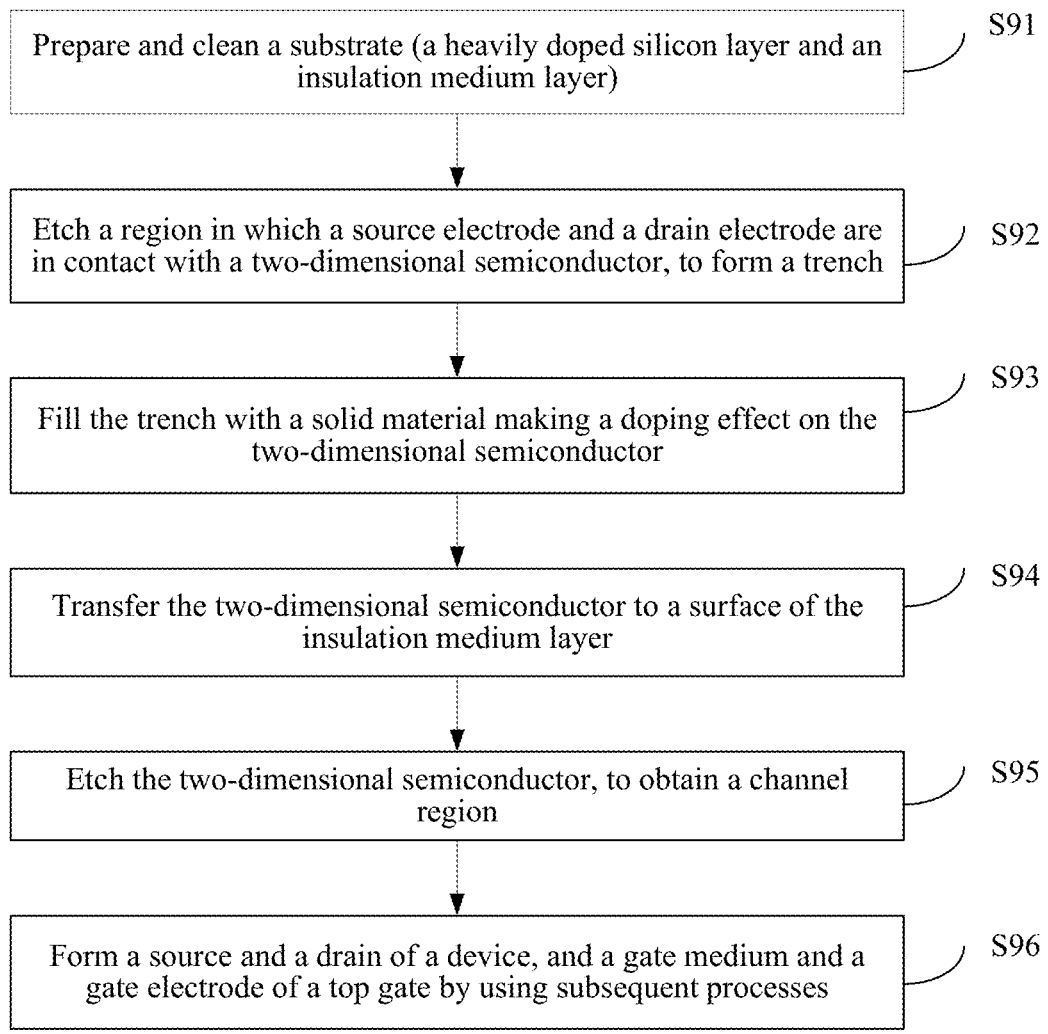
FIG. 9 is another flowchart of manufacturing a MOSFET based on a two-dimensional semiconductor according to an embodiment of the present disclosure.
Figure 10:
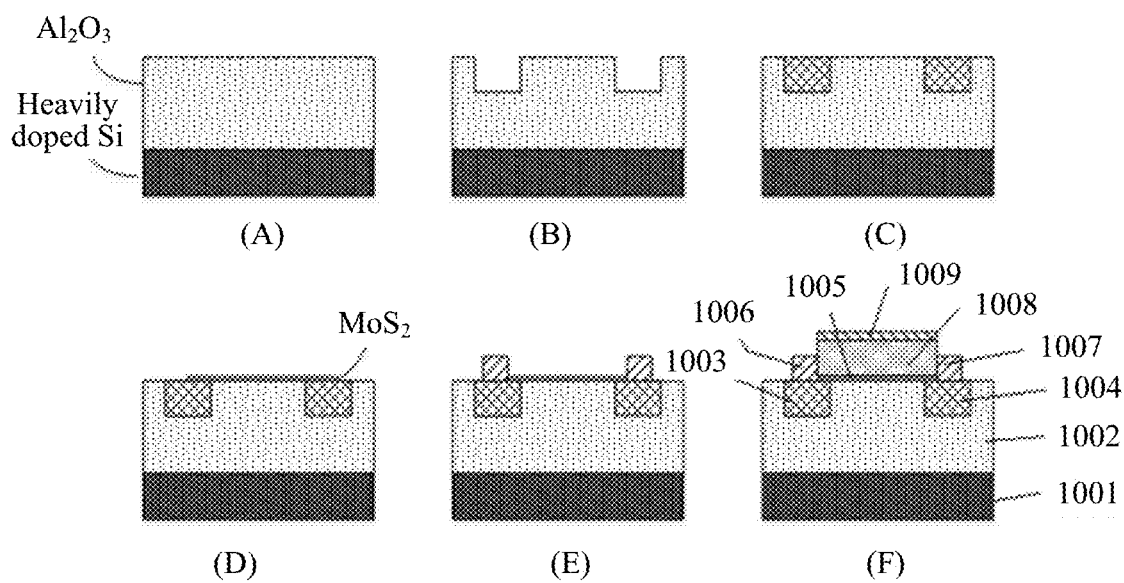
FIG. 10 is another structural side view illustrating manufacturing of a MOSFET based on a two-dimensional semiconductor according to an embodiment of the present disclosure.

In this embodiment, a local substrate medium is replaced, to reduce contact resistance of a metal/two-dimensional semiconductor ($MoS_2$ is still used as an example) in a MOSFET. The replacing the local substrate medium herein is filling a local region of an insulation medium layer with another solid material making a doping effect on the two-dimensional semiconductor. As shown in FIG. 9, a process of manufacturing the MOSFET includes the following steps:

S91. Prepare and clean a substrate, as shown in FIG. 10(A). In this embodiment, $Al_2O_3$ is used as an example of an insulation medium.

S92. Define a contact region of a metal/two-dimensional semiconductor in a device by using a photoetching process, and etch away $Al_2O_3$ at a corresponding location by using the photoetching process, to form a trench, as shown in FIG. 10(B).

S93. Fill the trench with a material making a doping effect on the two-dimensional semiconductor, to form a filled region, as shown in FIG. 10(C). For displaying an n-type two-dimensional semiconductor material on $Al_2O_3$, such as $MoS_2$ or $WS_2$ in this embodiment, the trench is filled with a material such as $Cs_2CO_3$ that may increase electron density. For displaying a p-type two-dimensional semiconductor material (such as black phosphorus or SnO) on $Al_2O_3$, the trench is filled with a material that may increase hole concentration, for example, $MoO_3$.

S94. Transfer a single layer or a small quantity of layers of $MoS_2$ to a surface of the insulation medium layer.

S95. Etch $MoS_2$ according to a doping location and a device size requirement, to obtain a channel region, as shown in FIG. 10(D).

S96. Form a source electrode and a drain electrode of the device, and a gate medium and a gate electrode of a top gate by using photoetching, metal deposition, a lift-off process, and a gate medium deposition process, as shown in FIG. 10(E) and FIG. 10(F).

As shown in FIG. 10(F), the MOSFET manufactured by means of this embodiment includes:

a heavily doped silicon layer 1001, an insulation medium layer 1002, a channel region 1005, a first electrode 1006, a second electrode 1007, a gate medium 1008, and a gate electrode 1009. A material of the insulation medium layer 1002 is $SiO_2$ or a high-k medium. The channel region 1005 is a two-dimensional semiconductor layer.

The insulation medium layer 1002 is provided with a first filled region 1003 and a second filled region 1004. The first filled region 1003 and the second filled region 1004 are filled with a solid material making a doping effect on the two-dimensional semiconductor layer 1005.

The two-dimensional semiconductor layer 1005 is located on the insulation medium layer 1002. A part of the two-dimensional semiconductor layer is located on a doped region 1003. An area of the doped region 1003 is smaller than an area of the channel region 1005.

The first electrode 1006 and the second electrode 1007 are located on two sides of the channel region 1005, and are used as a source and a drain of the MOSFET. The gate medium 1008 is located on the channel region 1005. The gate electrode 1009 is located on the gate medium 1008.

For a two-dimensional semiconductor material exhibiting an n-type conduction characteristic on the insulation medium layer, the trench is filled with a material that may increase electron density. For a two-dimensional semiconductor material exhibiting a p-type conduction characteristic on the insulation medium layer, the trench is filled with a material that may increase hole concentration.

Embodiment 5

Figure 11:
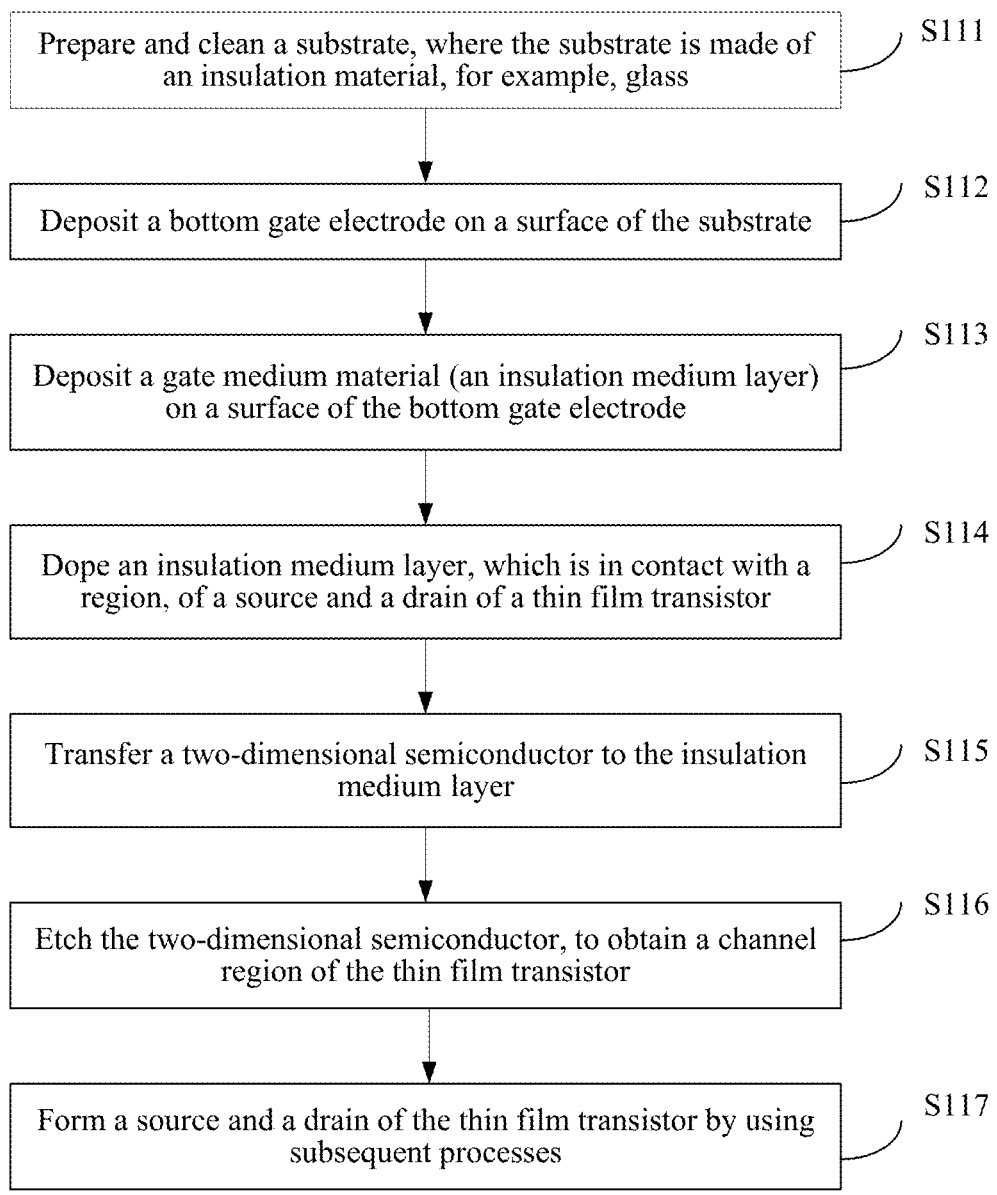
FIG. 11 is a flowchart of manufacturing a thin film transistor according to an embodiment of the present disclosure.

In this embodiment, an insulation medium layer, which is in contact with a region, of a source and a drain of a thin film transistor of a two-dimensional semiconductor is doped, to reduce contact resistance of the source and the drain of the thin film transistor. Operation of the thin film transistor in this embodiment is controlled by using a bottom gate. As shown in FIG. 11, a method for manufacturing a thin film transistor based on a two-dimensional semiconductor includes the following steps.

Figure 12:
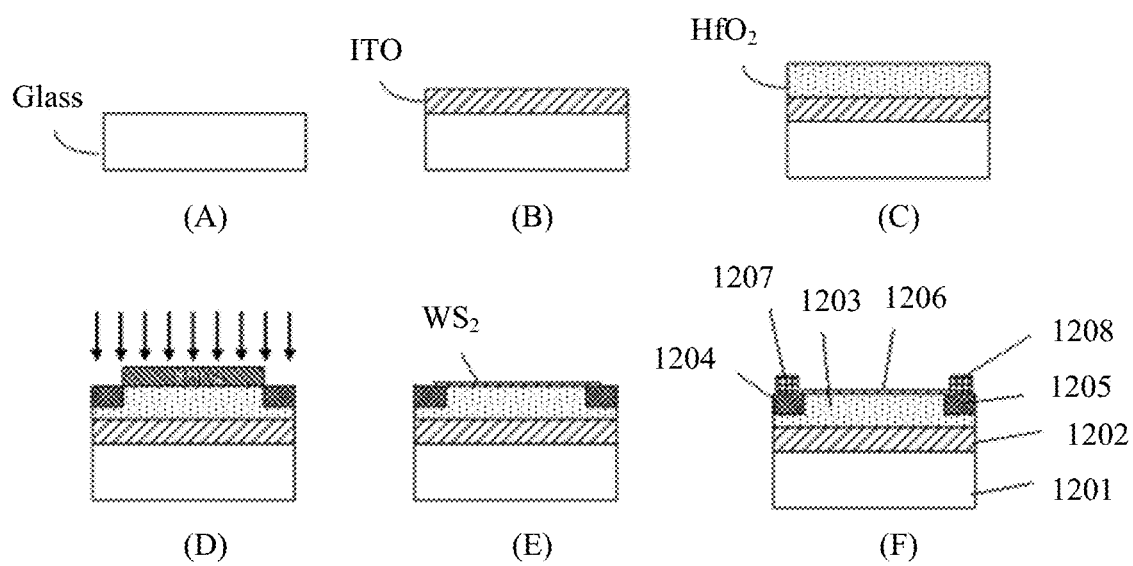
FIG. 12 is a structural side view illustrating manufacturing of a thin film transistor according to an embodiment of the present disclosure.

S111. Prepare and clean a substrate, as shown in FIG. 12(A). The substrate material is an insulation material, including glass, quartz, sapphire, ceramic, plastic, PI, PET, or the like. A glass substrate is used as an example in this embodiment. The substrate herein is different from the substrate in Embodiment 1 to Embodiment 4.

S112. Form a bottom gate electrode of the thin film transistor on a surface of the insulation substrate by using a process, such as photoetching or thin film deposition, as shown in FIG. 12(B). The bottom gate electrode may be made of a metal material, such as gold (Au), titanium (Ti), nickel (Ni), or platinum (Pt), or may be ITO. An example of ITO is used in this embodiment.

S113. Deposit a gate medium material on a surface of the bottom gate electrode. The gate medium material is equivalent to the insulation medium layer in this embodiment of the present disclosure, as shown in FIG. 12(C). The gate medium material may be $SiO_2$, or may be a high-k material, such as $Al_2O_3$, $HfO_2$, $ZrO_2$, $TiO_2$, or $La_2O_3$. An example of $HfO_2$ is used in this embodiment.

S114. Dope the insulation medium layer, which is in contact with a region, of a source and a drain of the thin film transistor, to reduce contact resistance of the source and the drain of the thin film transistor, as shown in FIG. 12(D). For an n-type thin film transistor, n-type doping needs to be performed. For a p-type thin film transistor, p-type doping needs to be performed. A type of a doping source used during doping is the same as that in Embodiment 1. In this embodiment, $WS_2$ is used as an example of the two-dimensional semiconductor. Therefore, n-type doping needs to be performed on a medium of the region in which the source and the drain are located.

S115. Transfer a single layer or a small quantity of layers of $WS_2$ to a surface of the insulation medium layer.

S116. Etch the two-dimensional semiconductor, to obtain a channel region of the thin film transistor, as shown in FIG. 12(E).

S117. Manufacture a source electrode and a drain electrode, to form the thin film transistor, as shown in FIG. 12(F).

The thin film transistor manufactured in this embodiment is shown in FIG. 12(F), and includes:

a substrate 1201, a bottom gate electrode 1202, an insulation medium layer (a bottom gate medium) 1203, a channel region 1206, a first electrode 1207, and a second electrode 1208. The insulation medium layer is provided with a first doped region 1204 and a second doped region 1205. The first doped region 1204 and the second doped region 1205 are respectively located beneath contact regions of the first electrode 1207 and the second electrode 1208. The first electrode 1207 and the second electrode 1208 are used as a source and a drain. The bottom gate electrode 1202 is located on the substrate 1201, the insulation medium layer 1203 is located on the bottom gate electrode 1202, the channel region 1206 is located on the insulation medium layer 1203, and the first electrode 1207 and the second electrode 1208 are located on two sides of the channel region 1206. Different from the foregoing embodiment, the thin film transistor has a bottom gate electrode, and has no top gate. The channel region 1206 is a two-dimensional semiconductor layer, and the first doped region 1204 and the second doped region 1205 include dopants making a doping effect on the two-dimensional semiconductor. For an n-type thin film transistor, a doping effect is n-type doping. For a p-type thin film transistor, a doping effect is p-type doping.

The foregoing five different embodiments have described different application scenarios in which the insulation medium layer on which the two-dimensional semiconductor layer is located is regionally doped or is locally filled with different solid material media, to implement a manufacturing process of doping a two-dimensional semiconductor material. An actual application scenario is not limited thereto. In addition, the methods used in the foregoing embodiments may be combined for use. For example, performing regional heavy doping on the insulation medium on which the contact regions of the source and the drain are located in Embodiment 1 may achieve an objective of reducing contact resistance of a metal/two-dimensional semiconductor. This has an effect similar to an effect of a local medium filling method used in Embodiment 4.

In the present disclosure, the insulation medium layer on which the two-dimensional semiconductor is located is regionally doped or is locally filled with different solid material media, to dope the two-dimensional semiconductor material. This has the following advantageous effects:

Compared with doping methods such as substitutional doping of a metal atom, plasma doping, and a conventional ion injection, the present disclosure can significantly reduce damage caused by doping to the two-dimensional semiconductor material, and reduce defect density introduced in the two-dimensional semiconductor material in a doping process.

Compared with a doping method in which a gas ion is used to transfer a surface charge, the embodiments of the present disclosure do not cause a problem similar to reliability of a device, and performance of a doped device may keep relatively stable.

Compared with a doping method in which a covering layer is added to a surface of the two-dimensional semiconductor material to implement doping, the present disclosure can reduce a leakage current between the source and the drain of the device and reduce an on/off ratio.

Regional doping is conveniently performed and a threshold voltage of the device is conveniently adjusted.

The foregoing embodiments are embodiments of the present disclosure, and are not intended to limit the present disclosure.

What is claimed is:

1. An electronic device, comprising:
   an insulation medium layer having a doped region;
   a channel region comprising a two-dimensional semiconductor material, wherein the two-dimensional semiconductor material is disposed above the insulation medium layer and at least partially above and adjacent to the doped region, wherein the doped region includes a dopant making a doping effect on a two-dimensional semiconductor layer, wherein the doping effect is n-type or p-type, and wherein the electronic device is a field effect transistor (FET);
   a first electrode and a second electrode disposed on two sides of the channel region, wherein the first electrode is a source and the second electrode is a drain;
   a heavily doped silicon layer located beneath the insulation medium layer; and
   a gate region comprising:
      a gate medium disposed above the channel region; and
      a gate electrode disposed above the gate medium.

2. The electronic device according to claim 1 wherein the insulation medium layer comprises:
SiO$_2$; or
a high-k dielectric material.

3. The electronic device according to claim 1, wherein the channel region comprises a first channel region and a second channel region, wherein the source comprises a first source and a second source, wherein the drain comprises a first drain and a second drain, wherein the gate region comprises a first gate region and a second gate region, wherein the doped region comprises a first doped region and a second doped region, wherein a doping type of the first doped region is n-type doping, wherein the first channel region is located on the first doped region, the first source and the first drain are located on two sides of the first channel region, wherein the first gate region comprises a first gate medium and a first gate electrode, wherein the first gate medium is located on the first channel region, wherein the first gate electrode is located on the first gate medium, wherein a doping type of the second doped region is p-type doping, wherein the second channel region is located on the second doped region, wherein the second source and the second drain are located on two sides of the second channel region, wherein the second gate region comprises a second gate medium and a second gate electrode, wherein the second gate medium is located on the second channel region, and wherein the second gate electrode is located on the second gate medium.

4. The electronic device according to claim 1, wherein the FET is a gate-controlled P-N junction; and
wherein the two-dimensional semiconductor material exhibits an n-type conduction characteristic on the insulation medium layer, wherein a doping type of the doped region is p-type doping, and wherein an area of the doped region is smaller than an area of the channel region, or
wherein the two-dimensional semiconductor material exhibits a p-type conduction characteristic on the insulation medium layer, wherein a doping type of the doped region is n-type doping, and wherein an area of the doped region is smaller than an area of the channel region.

5. The electronic device according to claim 1, wherein the two-dimensional semiconductor material comprises any one of the following: MoS$_2$, MoSe$_2$, MoTe$_2$, WS$_2$, WSe$_2$, WTe$_2$, GeS$_2$, GeSe$_2$, GeTe$_2$, SnS$_2$, SnSe$_2$, SnTe$_2$, SnO, PbS$_2$, PbSe$_2$, PbTe$_2$, GaS, GaSe, GaTe, InS, InSe, InTe, Bi$_2$Se$_3$, graphene, black phosphorus, arsenene, antimonene, germanene, stanene, or silicene.

6. The electronic device according to claim 2, wherein the insulation medium layer comprises high-k dielectric material comprising any one of the following: Al$_2$O$_3$, WO$_3$, Ta$_2$O$_5$, HFO$_2$, ZnO$_2$, TiO$_2$, CaO, ZrO$_2$, La$_2$O$_3$, BaO, MgO, HfSiO$_x$, ZrSiO$_x$, HfLaO$_x$, HfZrO$_x$, HfAlO$_x$, LaAlO$_x$, Y$_2$O$_3$, SrO, or Si$_3$N$_4$.

7. The electronic device according to claim 1, wherein the channel region comprises n layers of the two-dimensional semiconductor material, and wherein n is 1 to 10.

8. A method for manufacturing an electronic device based on a two-dimensional semiconductor, the method comprising:
forming an insulation medium layer above a heavily doped silicon layer;
forming a doped region in the insulation medium layer;
transferring a two-dimensional semiconductor material onto the insulation medium layer, wherein the two-dimensional semiconductor material is disposed at least partially above and adjacent to the doped region, wherein the doped region includes a dopant making a doping effect on a two-dimensional semiconductor layer, and wherein the doping effect is n-type or p-type;
obtaining a channel region by etching the two-dimensional semiconductor according to a device size requirement and an area of the doped region using a plasma etching process, wherein an area of the doped region is larger than that of the channel region;
forming a first electrode and a second electrode on two sides of the channel region, wherein the first electrode is a source and the second electrode is a drain;
forming a gate medium above the channel region; and
forming a gate electrode above the gate medium.

9. The method according to claim 8 wherein the insulation medium layer comprises:
SiO$_2$; or
a high-k dielectric material.

10. The method according to claim 8, wherein the electronic device is a field effect transistor, wherein the field effect transistor is a gate-controlled P-N junction,
wherein the two-dimensional semiconductor material exhibits an n-type conduction characteristic on the insulation medium layer, wherein a doping type of the doped region is p-type doping, and wherein an area of the doped region is smaller than an area of the channel region; or
wherein the two-dimensional semiconductor exhibits a p-type conduction characteristic on the insulation medium layer, wherein a doping type of the doped region is n-type doping, and wherein an area of the doped region is smaller than an area of the channel region.

11. The method according to claim 8, wherein the doping effect is generated by an n-type dopant, and wherein a doping source of the n-type dopant comprises at least one of the following: a plasma, a gas, and a chemical reagent that each contain amidogen, a gas and a solution that each comprise sodium ions, potassium ions, and chloridions, a polyethyleneimine (PEI) solution, a p-toluene sulfonic acid (PTSA) solution, a benzyl viologen (BV) solution, a nicotinamide adenine dinucleotide (NADH) solution, or a polyvinyl alcohol (PVA) solution.

12. The method according to claim 8, wherein the doping effect is generated by a p-type dopant, and wherein a doping source of the p-type dopant comprises at least one of the following:
a plasma or a gas containing oxygen and fluorine, a Br$_2$, I$_2$, or AuCl$_3$ solution, a solution containing Pt, Ag, Au, Pd, or Sc metal nano-particles, a 2,3,5,6-tetrafluoro-7,7',8,8'-tetracyano-p-benzoquinodimethane F$_4$TCNQ solution, or a 7,7,8,8-tetracyano-quinodimethane TCNQ solution,
wherein the plasma containing oxygen and fluorine comprises: an SF$_6$ plasma, a CHF$_3$ plasma, a CF$_4$ plasma, and an O$_2$ plasma, and wherein the gas containing oxygen and fluorine comprises ozone and NO$_2$.

13. The method according to claim 8, wherein forming the insulation medium layer comprises:
etching the insulation medium layer to form a trench; and
filling the trench with the insulation medium layer to form the doped region, wherein the insulation medium layer comprises a solid material.

14. The method according to claim 13, wherein the doping effect is generated by:
an n-type dopant disposed within the insulation medium layer and the solid material comprising Cs$_2$CO$_3$; or a p-type dopant disposed within the insulation medium layer and the solid material comprising $MoO_3$.

15. An electronic device, comprising:
an insulation medium layer having a doped region;
a channel region comprising a two-dimensional semiconductor material, wherein the two-dimensional semiconductor material is disposed above the insulation medium layer and the two-dimensional semiconductor material is disposed at least partially above and adjacent to the doped region, wherein the doped region includes a dopant making a doping effect on a two-dimensional semiconductor layer, wherein the doping effect is n-type or p-type, and wherein the electronic device is a thin film transistor;
a first electrode and a second electrode disposed on two sides of the channel region, wherein the first electrode is a source and the second electrode is a drain;
a gate electrode disposed below and adjacent to the insulation medium layer; and
an insulation substrate disposed below and adjacent to the gate electrode.

16. The electronic device according to claim 15 wherein the insulation medium layer comprises:
$SiO_2$; or
a high-k dielectric material.

17. The electronic device according to claim 15, wherein the two-dimensional semiconductor material comprises any one of the following: $MoS_2$, $MoSe_2$, $MoTe_2$, $WS_2$, $WSe_2$, $WTe_2$, $GeS_2$, $GeSe_2$, $GeTe_2$, $SnS_2$, $SnSe_2$, $SnTe_2$, $SnO$, $PbS_2$, $PbSe_2$, $PbTe_2$, $GaS$, $GaSe$, $GaTe$, $InS$, $InSe$, $InTe$, or $Bi_2Se_3$.

18. The electronic device according to claim 15, wherein the insulation medium layer comprises high-k dielectric material.

19. The electronic device according to claim 18, wherein the high-k dielectric material comprises any one of the following: $Al_2O_3$, $WO_3$, $Ta_2O_5$, $HfO_2$, $ZnO_2$, $TiO_2$, $CaO$, $ZrO_2$, $La_2O_3$, $BaO$, $MgO$, $HfSiO_x$, $ZrSiO_x$, $HfLaO_x$, $HfZrO_x$, $HfAlO_x$, $LaAlO_x$, $Y_2O_3$, $SrO$, or $Si_3N_4$.

20. The electronic device according to claim 15, wherein the two-dimensional semiconductor material comprises any one of the following: graphene, black phosphorus, arsenene, antimonene, germanene, stanene, or silicene.

* * * * *